United States Patent [19]

Marchetti et al.

[11] Patent Number: 4,501,787
[45] Date of Patent: Feb. 26, 1985

[54] FLAME RETARDANT B-STAGED EPOXY RESIN PREPREGS AND LAMINATES MADE THEREFROM

[75] Inventors: Joseph R. Marchetti, Hempfield Township, Westmoreland County, Pa.; Wilbur R. Thomas, Hampton, S.C.

[73] Assignee: Westinghouse Electric Corp., Pittsburgh, Pa.

[21] Appl. No.: 490,098

[22] Filed: Apr. 29, 1983

[51] Int. Cl.³ .................. B32B 7/00; B32B 17/10; H05K 1/00
[52] U.S. Cl. .................................... 428/236; 428/248; 428/251; 428/285; 428/288; 428/290; 428/415; 428/432; 428/460; 428/464; 428/477.4; 428/458; 428/416; 428/436; 428/530; 428/901; 428/920; 174/68.5
[58] Field of Search ............... 428/415, 460, 432, 464, 428/477.4, 458, 416, 901, 436, 920, 530, 236, 285, 248, 288, 251, 290

[56] References Cited

U.S. PATENT DOCUMENTS

| | | | |
|---|---|---|---|
| 3,536,546 | 10/1970 | Nielsen et al. | 428/415 X |
| 3,549,478 | 12/1970 | Gillery et al. | 428/415 X |
| 3,895,158 | 7/1975 | Gause et al. | 428/220 |
| 4,021,403 | 5/1977 | Fujiwara et al. | 428/416 X |

*Primary Examiner*—Patricia C. Ives
*Attorney, Agent, or Firm*—D. P. Cillo

[57] ABSTRACT

A prepreg useful in flame resistant copper clad printed circuit boards is made by impregnating a porous substrate with an impregnant containing: either a prebrominated epoxy resin or a mixture of a non-halogenated epoxy resin and flame retarding additive containing bromine, and phenolic hydroxyl groups. A phenolic novolac oligomer having an average of over 2.5 phenolic hydroxyl groups per oligomeric unit is used as curing agent. Optionally, a suitable catalyst may be included. The impregnated substrate is heated to cure or advance the resin to the "B"-stage.

23 Claims, 2 Drawing Figures

FLAME RETARDANT B-STAGED EPOXY RESIN PREPREGS AND LAMINATES MADE THEREFROM

BACKGROUND OF THE INVENTION

Flame resistant, epoxy resin impregnated, glass cloth laminates have been used in the printed circuit industry to make high grade copper clad circuit boards. These high grade circuit boards must have excellent electrical properties, superior dimensional stability and mechanical strength, and outstanding chemical resistance. Moisture resistant laminates of this type are taught by Alvino et al., in U.S. Pat. No. 4,327,143. There, bisphenol A or epoxy novolac resins, are mixed with tetrabromobisphenol A, a flame retardant agent, at about 90° C. After mixing and cooling, an epoxy diluent is added, followed by addition of a dicyandiamide derivative (N-cyano-N'-hydroxymethyl guanidine) used as a curing agent, to provide an impregnating resin. This resin is impregnated into glass cloth sheet material which could be used to make NEMA (National Electrical Manufacturers Association) FR-4 grade laminates.

While these laminates have excellent properties, the search continues for glass cloth and cellulosic paper based laminates having improved thermal aging characteristics, higher bond strength and heat distortion temperatures, i.e., Tg values, and even better blister resistance; and for "B"-staged prepregs, useful for manufacturing such laminates, having improved shelf life, and low levels of ionic contamination.

Pucci, in U.S. Pat. No. 4,311,753, attempted to solve problems of poor "B"-staged prepreg shelf life, and laminate solvent resistance, for glass cloth based prepregs and laminates useful in manufacturing flame resistant copper clad circuit boards. There, glass cloth "B"-staged prepregs are made, impregnated with a resin containing: a di and tetra functional epoxy mixture consisting of a brominated epoxy resin, such as a reacted mixture of bisphenol A epoxy and tetrabromobisphenol A, and a polyglycidyl ether of tetraphenylethane; dicyandiamide curing agent; a tetraalkylguanidine catalyst; and a solvent. Pucci et al., in U.S. Pat. No. 4,343,731, attempted to solve wetting properties of epxoy resins used in impregnating solutions for woven glass cloth. There, an epoxy resin is formulated from the fusion product of bisphenol A epoxy, quarternary phosphonium halide catalyzed bisphenol A epoxy, and tetrabromobisphenol A. This is used in combination with a dicyandiamide containing curing agent and solvent.

In the area of flame resistant paper based laminates for copper clad circuit board application, Nichols, in U.S. Pat. No. 3,804,693, attempted to improve room temperature shearing, blanking, punching, and other fabricating properties. There, a paper web is first impregnated with a water soluble phenolic resin mixed with a solvent, such as methyl alcohol. Then, the wetted paper web is impregnated with an epoxy modified phenolic resin comprising an admixture of: oil and/or rosin modified phenolic resin; water soluble phenolic resin; and bisphenol A epoxy resin; to which is added a brominated or chlorinated flame resistant additive, such as chlorinated bisphenyl or tris(2,3-dibromopropyl)-phosphate, mixed with antimony oxide. The phenolic resins taught are of the resole type, where the mole ratio of (phenol):(formaldehyde) is from (1):(1 to 1.5).

Claybaker, in U.S. Pat. Nos. 4,043,954 and 4,254,187, makes flame resistant laminates from paper web sheets impregnated with an opoxy modified phenolic resin mixture containing: tung oil modified phenolic resole resin; epoxy resin prepared from a tetrabromobisphenol A; a flame retardant mixture of triphenyl phosphate and antimony trioxide; barium hydrate; low viscosity, catalyzed phenol-formaldehyde resin to facilitate paper penetration; and solvent.

Lee & Neville, in the *Handbook of Epoxy Resins*, McGraw-Hill, 1967, ch. 11-13 to 11-16, teach a wide variety of curing agents for epoxies, including resole phenolformaldehyde resins; and also solid, high molecular weight phenolic novolac resins for use with high melting point bisphenol A epoxy resins in solvent solution, when catalyzed with benzyldimethylamine.

Flame resistant composite laminates, made from a resin impregnated cellulose paper core bonded to resin impregnated woven glass cloth, are taught by Gause et al., in U.S. Pat. No. 3,895,158. There, resins comprising bisphenol A or novolac epoxy, in combination with chlorinated phenol or brominated epoxy flame retardants, and curing agents such as dicyandiamide, are used in the glass cloth layer. The cellulose paper layer is impregnated with the same epoxy resin but using an anhydride curing agent.

The improvements described in the prior art do not, however, completely solve "B"-staged prepreg shelf life problems, or problems associated with possible attack of nitrogen cross link junctions introduced by dicyandiamide type curing agents, upon thermal aging. Nor has there been a completely satisfactory solution to moisture resistance problems which also addresses bond strength problems and improved flexural strength upon thermal aging. Thus, there is a need for new and improved flame resistant "B"-staged prepregs for copper clad printed circuit boards and other applications.

SUMMARY OF THE INVENTION

The above needs have been met and the above problems solved, by providing a "B"-staged prepreg of a reinforcing substrate, such as woven fibrous glass cloth, impregnated with an epoxy resin cured with a selected class of phenolic novolac. Useful epoxy resins comprise: (I) a brominated epoxy resin or (II) a mixture of (A) non-halogenated epoxy resin, such as bisphenol A epoxy, cycloaliphatic epoxy and novolac epoxy or mixtures thereof and (B) a flame retarding reactive additive containing bromine and phenolic hydroxyl groups, preferably tetrabromobisphenol A, and (III) phenolic novolac as a curing agent.

The preferred phenolic novolac is an oligomer having a low free phenol content, and an average of from 2.5 to 15, preferably from 4 to 8, phenolic hydroxyl groups per oligomeric unit.

The phenolic novolac oligomer is employed in an amount to provide a combined total of phenolic hydroxyl equivalents in the impregnating composition that is essentially less than or equal to the combined total of epoxy equivalents that are present. Thus, there will ideally be no unreacted phenolic hydroxyl groups, and there will preferably be an excess of unreacted epoxy groups. Here, equivalents=weight/equivalent weight. Preferably, the bromine content of the composition will provide a bromine range of from about 10 weight percent to about 20 weight percent of the cured resin.

The resin composition is impregnated into a porous substrate, such as paper or fibrous glass cloth, and "B"-staged, i.e., heated to provide a dry but not completely cured prepreg. These "B"-staged prepregs can be stacked in a press, and cure laminated to make: NEMA FR-4 grade laminates when epoxy resin impregnated woven glass cloth is used as the top, bottom and core layers, NEMA CEM-1 grade composite epoxy laminates when epoxy resin impregnated woven glass cloth is used as the top and bottom layer for an epoxy resin impregnated cellulose paper core, NEMA CEM-3 grade composite epoxy laminates when epoxy resin impregnated glass cloth is used as the top and bottom layer for an epoxy resin impregnated unwoven glass fiber core, and the like. These last two composite laminates provide good performance with lower cost than the higher grade FR-4 laminates. All of these laminates can have copper circuitry applied by well known additive or subtractive techniques. Some "B"-staged prepregs can also be used in making multilayer circuit boards.

All of the laminates of this invention, made from these "B"-staged prepregs, have good fabricating properties, outstanding heat distortion temperatures, i.e., Tg (glass transition) values, superior blister and solvent resistance, excellent bond strength and moisture resistance, and excellent flexural strength upon thermal aging. Also, the "B"-staged prepregs of this invention have excellent shelf life, and low levels of ionic contamination, contributing to outstanding electrical properties.

BRIEF DESCRIPTION OF THE DRAWINGS

For a better understanding of the invention, reference may be made to the preferred embodiments exemplary of the invention, shown in the accompanying drawings in which.

DESCRIPTION OF THE PREFERRED EMBODIMENTS

Figure 1:
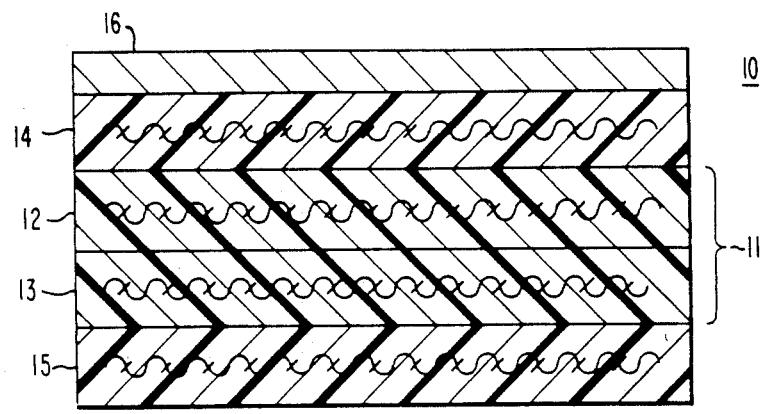
FIG. 1 is a cross-sectional view of one embodiment of a unitary, consolidated high pressure laminate in accordance with this invention, suitable as a printed circuit board.

Brominated epoxies are especially useful in the class of widely used flame retardant electrical grade laminates such as the NEMA Grade FR-4 laminates. Examples of readily commercially available pre-reacted brominated epoxy resins are the DER 511, DER 521 and DER 524 series offered by Dow Chemical Company. These prebrominated epoxy resins are (I) polyglycidyl ethers of bisphenol A and/or tetrabromobisphenol A. Flame retardant electrical grade laminates may also be made from (II) a mixture of (A) one or more non-halogenated epoxy resins, including polyglycidyl ethers of bisphenol A and (B) a flame retarding reactive additive, such as tetrabromobisphenol A. As will become apparent hereafter, tetrabromobisphenol A may be employed in combinations with a variety of non-halogenated epoxy resins, particularly mixtures that include cycloaliphatic epoxy.

Although tetrabromobisphenol A is preferred as (B) above, other reactive flame retarding additives which contain phenolic hydroxyl groups may also be used in (B). An example of an alternative brominated phenol is 1,3,5-tribromophenol. Tetrabromobisphenol A has 2 phenolic hydroxyl groups. The 1,3,5-tribromophenol has 1 phenolic hydroxyl group. The number of phenolic hydroxyl equivalents of these components, i.e. OH groups attached to an aromatic ring=molecular weight/hydroxyl equivalent weight.

Useful (A) non-halogenated epoxy resins include glycidyl polyethers, whose principal structure may be represented by the chemical formula:

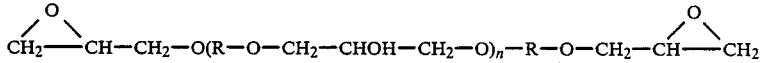

where n is an integer of the series 0, 1, 2, 3 . . . , and R represents the divalent hydrocarbon radical of the dihydric phenol. Typically R is derived from bisphenol A or bis-phenol F. These bisphenol type epoxy resins used in the invention have a 1,2 epoxy equivalency greater than one. They will generally be diepoxides. By the term "epoxy equivalent", is meant the number of 1,2 epoxy groups,

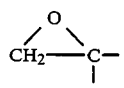

contained in the average molecule of the glycidylether. Typically, epoxy resins of bisphenol are readily available in commercial quantities and reference may be made to the *Handbook of Epoxy Resins*, by Lee and Neville, for a complete description of their synthesis.

Other (A) non-halogenated epoxy resins that are particularly useful in this invention include polyglycidylethers of a novolac, and cycloaliphatic epoxies. The polyglycidylethers of a novolac suitable for use in accordance with this invention are prepared by reacting an epihalohydrin with phenol formaldehyde condensates. The product of the reaction is generally a massive oxidation resistant aromatic compound. Although epoxy novolac resins from formaldehyde are generally preferred for use in this invention, epoxy novolac resins from any other aldehyde such as, for example, acetaldehyde, chloraldehyde, butylaldehyde, fufuraldehyde, can also be used. Although the above formula shows a completely epoxidized novolac, other epoxy novolacs which are only partially epoxidized can be useful in this invention. An example of a suitable epoxy novolac is 2,2, bis[p-(2,3-epoxypropoxy)phenyl]-methane. These resins are well known in the art and reference may be made to the *Handbook of Epoxy Resins* for a complete description of their synthesis.

The cycloaliphatic type (A) non-halogenated epoxy resins employed as the resin ingredient in the invention are selected from non-glycidyl ether epoxides containing more than one 1,2 epoxy group per molecule. These are generally prepared by epoxidizing unsaturated aromatic hydrocarbon compounds, such as cyclo-olefins, using hydrogen peroxide or peracids such as peracetic acid and perbenzoic acid. The organic peracids are generally prepared by reacting hydrogen peroxide with either carboxylic acids, acid chlorides or ketones to give the compound R—COOOH. These resins are well known in the art and reference may be made to Brydson, J., *Plastic Materials*, 1966, p. 471, for their synthesis and description.

Examples of these non-glycidyl ether cycloaliphatic epoxides would include 3,4-epoxycyclohexylmethyl-3,4-epoxy-cyclohexane carboxylate (containing two epoxide groups which are part of ring structures, and an ester linkage); vinyl cyclohexene dioxide (containing two epoxide groups, one of which is part of a ring structure); 3,4-epoxy-6-methylcyclohexylmethyl-3,4-epoxy-6-methylcyclohexane carboxylate, and dicyclopentadiene, having the following respective structures:

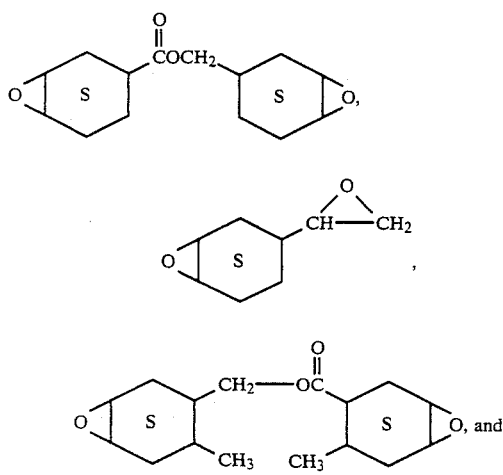

where S stands for a saturated ring structure.

Both of the (I) and II(A) epoxy resins can be characterized by reference to their epoxy equivalent weight, which is defined as the mean molecular weight of the particular resin divided by the mean number of epoxy groups per molecule. Thus, the number of epoxy equivalents=weight of the epoxy resin/epoxy equivalent weight. In the present invention, all of the suitable epoxy resins will have a preferred epoxy equivalent weight of from about 100 to about 1000.

With either the (I) or (II) resins, certain (III) phenolic novolacs are used as the curing agent. Phenolic novolacs are usually prepared by reacting phenol with formaldehyde in a molar ratio of (phenol):(formaldehyde) of about (1):(0.7 to 0.9) usually (1):(0.8) under acidic conditions. Under these conditions there is a slow reaction to form methylol phenols which then condense rapidly to form products of the dihydroxydiphenyl methane type, usually 2,4- and 4,4'dihydroxydiphenyl methane. These materials then slowly react with further formaldehyde to form their own methylol derivatives which in turn rapidly react with further phenol to produce higher molecular weight materials having the idealized chemical structural formula:

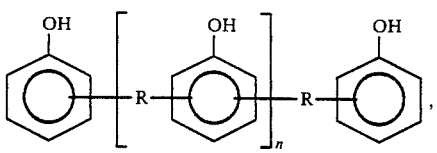

where R is usually $CH_2$, but can also be $C_2H_4$ and $C_3H_8$, when for example dichloroethane, and the like, is substituted for formaldehyde in the same molar ratio. Inclusion of alkyl groups over three carbons causes the Tg value as well as chemical and solvent resistance of the cured resin to drop significantly. Additionally, H on the aromatic rings can, in some instances, be substituted for by N or S. These novolacs themselves contain no reactive methylol groups, i.e., —$CH_2OH$, as do phenolic resoles. There can however be ether linkages, i.e., —O—, between novolac groups. The term "phenolic novolac" is here defined to include such N, S, $C_2H_4$ and $C_3H_8$ inclusions and ether linkages.

The phenolic novolacs useful as (III) curing agents for both (I) and (II) epoxy based impregnating resins of this invention must have, on the average, over 2.5 phenolic hydroxyl groups, i.e., OH groups attached to an aromatic ring, preferably an average of from 2.5 to 15 phenolic hydroxyl groups per oligomeric unit, and most preferably, an average of from 4 to 8 phenolic hydroxyl groups per oligomeric unit. A most preferred phenolic novolac oligomer is represented by the chemical structural formula:

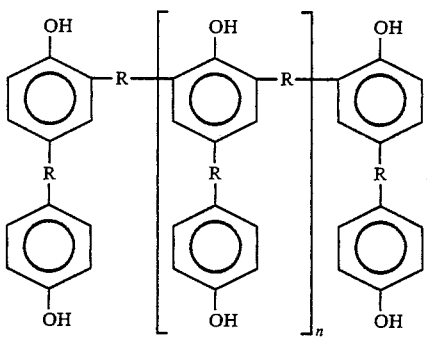

where each R group is selected from $CH_2$, $C_2H_4$, and $C_3H_8$, with $CH_2$ preferred, where the average of n=0 to 2, and isomers thereof.

The phenolic novolacs used herein should have a low free phenol content of less than about 1 weight percent free phenol. An average of over 15 phenolic hydroxyl groups per phenolic novolac oligomeric unit, the epoxy resin system will have a tendency to gel rapidly during "B"-staging, so that prepreg shelf life will be reduced drastically. Over about 1 weight percent free phenol and Tg (glass transition) values will be reduced substantially. Here again, the number of phenolic hydroxyl equivalents=weight of the phenolic novolac resin/hydroxyl equivalent weight.

Phenolic resoles are not desirable curing agents, in this invention, because their methylol groups form water upon reacting. If the water is not absorbed by the substrate, it may cause voids in or delamination of the circuit board. Phenolic novolacs on the other hand provide no by-products upon reacting. Additionally, phenolic resoles are usually made with ionic catalysts, such as sodium carbonate or ammonium hydroxide, which could contaminate and deleteriously affect the electrical properties of the circuit board.

In the cured resins of this invention, the phenolic hydroxyls of the tetrabromobisphenol A, for example, and the phenolic novolac oligomer react with and cross link the 1,2 epoxy groups in the epoxy resin, to provide a three dimensional structure. The use of phenolic novolac provides highly thermally stable, oxygen cross link junctions, resistant to chemical attack, rather than nitrogen cross link junctions resulting from use of dicyandiamide curing agents, which nitrogen junctions are subject to attack under high heat conditions—where the laminating resin contains from 10 weight percent to 20 weight percent bromine.

In the (II) resins, which employ (A) non-halogenated epoxy resin, the phenolic hydroxyls in both the (B) brominated phenol, such as tetrabromobisphenol A, and in the (III) phenolic novolac oligomer, should provide a combined total of phenolic hydroxyl equivalents that is less than or essentially equal to the combined total of epoxy equivalents. In the (I) prebrominated epoxy resin, the same ratio of phenolic hydroxyl equivalents (i.e., less than or essentially equal to the epoxy equivalents) should be maintained, recognizing that if no unreacted tetrabrominated bisphenol A is present, the only source of phenolic hydroxyls may be the phenolic novolac curing agent (III). In both cases, there will ideally be no unreacted phenolic hydroxyl groups, and preferably there will be an excess of unreacted epoxy groups. A substantial excess of phenolic hydroxyl groups results in degradation of the integrity of the cured resin. The preferred ratio of epoxy equivalents: phenolic hydroxyl equivalents is from 1:1, to about 1.2:1. Over about 1.2:1, thermal and chemical properties of the laminate start to fall. Any hydroxyl groups present on the epoxy resin are not considered particularly reactive and are not included in the total amount of hydroxyl equivalents for purposes of this invention.

Useful optional catalysts preferably include tertiary amines, such as, for example, triethanolamine, 2-dimethylamino-2-hydroxy propane, hexamethylenetetramine, pyridine, N,N-benzyldimethylamine, N,N-benzyldiethylamine, triethylamine, and the like; and imidazoles, such as, for example, imidazole, 1-methylimidazole, 2-methylimidazole, 2-ethyl-4-methylimidazole, and the like. These can be, and usually are, added in effective minor catalytic amounts. Use of these catalysts provides substantially higher Tg values for the cured resin, so their inclusion is preferred.

Optionally, effective minor amounts of epoxy diluents, having viscosities of between about 5 cps. to 200 cps. at 25° C., such as the diglycidyl ether of a glycol having from 2 to 12 carbon atoms in the glycol unit, for example, preferably, the diglycidyl ether of neopentyl glycol; as well as 1,4-butanediol diglycidyl ether; butyl glycidyl ether; bis(2,3-epoxy-2-methylpropyl)ether; 2,3-epoxy-3-phenoxy propane and the like, can be used to provide high solids, low viscosity impregnating solutions. A complete description of the synthesis of diglycidyl ether of neopentyl glycol is given in U.S. Pat. No. 3,868,613. Epoxy groups present in the epoxy diluent will be included in the total amount of epoxy equivalents for purposes of this invention. The impregnating resins of this invention will advantageously have viscosities of between about 225 cps. to 500 cps. at 25° C.

Useful solvents include oxygenated, not overly volatile solvents, such as, for example, methyl Cellosolve (ethylene glycol monomethyl ether), ethyl Cellosolve (ethylene glycol monoethyl ether), methyl ethyl ketone, methyl isobutyl ketone, dimethylformamide, and the like, and mixtures thereof. Acetone is relatively volatile, but may be used in admixture with xylene. As is well known, inorganic fillers can be added to fire resistant laminates. Examples of such fillers are listed in U.S. Pat. No. 4,371,579, and they may be used in the impregnating resin and, thus, in the prepregs and laminates of this invention, including particulate magnesium silicate, magnesium hydroxide, magnesium carbonate, calcium silicate, calcium carbonate, silica, aluminum trihydrate, mica, and their mixtures. Palladium compounds and other similar suitable fillers may also be used in resins for impregnating surface sheets where additive circuitry techniques are to be used, as is well known in the art.

Additives such as antimony trioxide, antimony pentoxide, and various phosphates, all well known in the art, may also be included, in minor amounts, to impart an additional degree of fire or flame resistance to the product. These materials can also substitute for the bromine containing flame retarding additive, and lower the bromine content of the cured resin to about 10% to 12%, without substantially harming the flame resistance of the final laminate. Such lowered bromine content may be desirable in some applications.

Referring now to FIG. 1 of the drawings, unitary, consolidated, high pressure laminate circuit board 10 is shown. Core 11, contains two resin impregnated sheets 12 and 13, disposed between resin impregnated outer surface sheets 14 and 15. The core 11 can contain from one to eight or more sheets. The entire laminate thickness including a top metal foil 16 is from about 5 mil to about 250 mil.

Resin is impregnated into each of the sheets 12, 13, 14 and 15, separately, usually by continuously passing porous sheet cellulosic paper, fibrous polyamide sheet, fibrous quartz sheet, woven fibrous glass cloth, unwoven fibrous glass mat, and the like, from a reel, through a treater trough containing an epoxy resin impregnant, then through rolls to remove excess resin, and then passing the impregnated sheet through a drying oven, to provide a "B"-staged prepreg, which is cut and stacked for storage. By "B"-staged is meant: the resin is heated in the sheet sufficiently to cause it to partially cure to a dry to the touch, non-tacky, fusible state, capable of further complete cure to the thermoset "C"-stage under heat and pressure. One obvious requirement of a "B"-staged prepreg is a long storage lifetime without undue moisture absorption or passage into the "C"-stage.

The cellulosic paper can be made from water-laid wood cellulose fibers which have been treated or fibrillated to provide a high degree of bonding between the fibers in the sheet, providing strength, so that the paper can be treated without auxiliary support. Other cellulose fibers, such as cotton linter cellulose fibers, may also be water-laid to provide high strength sheets and may also be employed. The term "cellulosic paper" is meant to include such types of fibers. Fibrous polyamide sheet sold by E. I. DuPont under the trade name "Kevlar" can also be advantageously used.

The glass fiber substrate can be woven or unwoven. Woven fibrous glass cloth is very strong and is used in the highest grades of copper clad laminates. This glass cloth is available in a plain weave of continuous filaments, in a variety of styles and finishes, generally varying from about 1 to 7 mils (0.001" to 0.007") in thickness and from about 0.6 to 6 oz./sq. yd. in weight. Further details on the impregnating process and useful cellulosic paper and fibrous glass sheet material, can be found in U.S. Pat. No. 3,895,158. Additionally, high grade, high purity glass cloth, i.e., fibrous quartz ($SiO_2$) sheet, although expensive, can be advantageously used in those specialized instances where a low coefficient of thermal expansion support material is required, for example, in some chip carrier circuit board applications.

One or more sheets of the "B"-staged prepreg can be stacked, along with a metal foil outer sheet 16, preferably copper, and laminated for 1 to 1½ hours, at from 150° C. to 200° C. and 500 psi. to 1500 psi, to "C"-stage the resin and bond all the component sheets together, providing circuit board 10. Copper foil, when used, is generally from about 0.7 mil to 2.8 mils thick, having a weight of from about ½ to 2 oz./sq. ft., respectively. A metal foil can also be bonded to the bottom of layer 15.

This type of metal clad laminate is used when subtractive circuitry techniques are to be employed, where a resist or suitable mask is applied over the copper foil and undefined copper portions are etched away with suitable etching solutions, to leave the desired circuit configuration. This is the common manner of making circuit patterns. However, if additive circuit techniques are to be used, the bonded laminate may not contain a foil layer at all. In this additive technique, copper circuitry is plated in a predetermined pattern through a resist or suitable mask onto the outer surface sheet, which is generally treated or catalyzed in some manner to make it more adhesive for the copper. Both subtractive and additive techniques have been used for many years and are well known in the art.

In FIG. 1, the metal foil layer 16 is shown without a circuit pattern. After etching, to provide the desired circuitry pattern, and removing the resist, a number of through holes may be drilled in or punched through the laminate. These through holes can be plated with copper and the like, usually by a combination of electrodless and electroplating techniques, to provide electrical leads through the circuit board. In many instances electrical components, such as diodes, transistors and the like, are soldered to conductor pads at temperatures of about 500° C. to 550° C., for about 20 seconds. This soldering can cause dimensional stability problems, if sophisticated resin systems are not used.

Referring again to FIG. 1, the highest grade, flame resistant, electrical laminate, NEMA FR-4, consists of epoxy resin impregnated woven glass cloth used as both the core 11 and surface sheets 14 and 15. This grade combines excellent electrical properties with excellent dimensional stability and excellent mechanical strength, it is expensive, however. Composite laminates can include NEMA CEM-1, where an epoxy resin impregnated cellulosic paper is used as the core 11, and epoxy resin impregnated glass cloth is used as surface sheets 14 and 15. NEMA CEM-3 grade laminates may have epoxy resin impregnated unwoven fibrous glass sheets as the core 11, and epoxy resin impregnated woven glass cloth as surface sheets 14 and 15. These composites are lower cost alternatives to the FR-4 grade. The epoxy resin impregnant of the various layers can be the impregnating resin of this invention.

Figure 2:
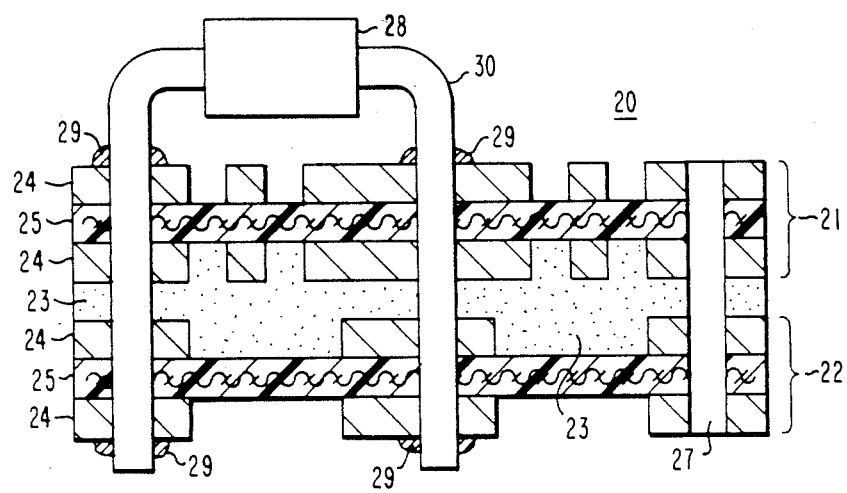
FIG. 2 is a cross-sectional view of one embodiment of a consolidated multilayer circuit board in accordance with this invention.

FIG. 2 shows a simplified cross-sectional view of a multilayer circuit board 20, composed of circuit board 21 and circuit board 22, bonded together with a resin impregnated glass fiber adhesive layer 23. Circuit boards 21 and 22 have etched copper conductor patterns 24 and resin impregnated glass cloth or other suitable supports 25. In manufacture, a "B"-staged adhesive layer 23 is disposed between two "C"-staged circuit boards 21 and 22 and then laminated under heat and pressure to cause the adhesive layer to flow and conform to the conductor patterns and to cure the adhesive layer and bond the circuit boards together.

Punched or drilled copper plated through holes, one of which is open, shown as 27 in FIG. 2, electrically connect copper circuits on circuit board 21 with copper circuits on circuit board 22. An electrical component 28 is shown attached to the circuit boards with a suitable solder 29, soldering lead 30 which passes through the board via through holes 27. In all instances the resin impregnant of the various layers can be the impregnating resin of this invention.

The following example illustrates the invention with an admixture of a non-halogenated bisphenol A epoxy resin and tetrabrominated bisphenol A.

EXAMPLE 1

A flame resistant, copper clad NEMA grade FR-4 laminate was made. A mixing vessel was charged, at 25° C., with 22.55 parts by weight (22.55 weight percent) of methyl Cellosolve solvent, to which was added, with good agitation: 10.34 parts by weight (10.34 weight percent) of 100% solids phenolic novolac oligomer having an average hydroxyl equivalent weight of about 107 (and containing 0.096 phenolic hydroxyl equivalents, i.e., 10.34/107) and a melt viscosity at 150° C. of from 800 cps. to 1000 cps., sold commercially by Union Carbide Corporation under the trade name "Phenolic Novolac BRWE 5833", as the curing agent.

To this solution was added: 25.27 parts by weight (25.27 weight percent) of 100% solids tetrabromobisphenol A as flame retarding additive, having an average hydroxyl equivalent weight of about 271.9 (and containing 0.093 phenolic hydroxyl equivalents, i.e., 25.27/271.9); 41.69 parts by weight (41.69 weight percent) of a 97% solids solution of a quaternary phosphonium halide salt latent catalyzed liquid diglycidyl ether of bisphenol A epoxy resin, having an epoxy equivalent weight of 193 and a viscosity of about 4,000 cps. at 25° C., (and containing 0.211 epoxy equivalents, i.e., [41.69/193]×0.97) sold commercially by Shell Chemical Company under the trade name "Epon 829"; and 0.15 parts by weight (0.15 weight percent) of 2-methyl imidazole as a catalyst. After final addition, the admixture was stirred for 30 minutes at 25° C., to provide a resinous solution having a viscosity of about 250 cps. at 25° C. In this resin admixture the combined total of phenolic hydroxyl equivalents was 0.189, and was less than the total epoxy equivalents of 0.211, i.e., the ratio of epoxy equivalents: phenolic hydroxyl equivalents was 1.12:1.

Style 7628, silane treated woven glass fiber cloth, having a weight of 6.0 oz/sq. yd., was impregnated with the described resin admixture in a resin trough, passed between rollers to remove excess resin, and "B"-staged in a drying oven at about 160° C. for about 7 minutes, to provide a resin ratio of about 1.75, i.e., 0.75 parts by weight resin to 1 part by weight glass fiber. Style 7642, silane treated woven glass fiber cloth, having a weight of 6.8 oz/sq. yd. was also impregnated with the described resin admixture and "B"-staged in a similar fashion, to provide a resin ratio of about 2.1, i.e., 1.1 parts by weight resin to 1 part by weight glass fiber.

Shelf life of these "B"-staged prepregs is at least 90 days at 25° C.

Four sheets of 50"×74" impregnated style 7642 woven glass cloth were used as a core between one top and one bottom impregnated style 7628 woven glass cloth surface sheet. This stack-up was then molded to one top sheet of one ounce copper foil at 1000 psi. and 160° C. for about 35 minutes, to provide, after cooling, a 1/16 inch flame resistant, copper clad, heat and pressure consolidated laminate. A series of tests were then run on the laminate and the results are given below in Table 1:

TABLE 1

| Property | Condition | Results |
|---|---|---|
| Bond | ASTM Cond. A | 10.2 lb./in. |
| Bond | 260° C. solder float for 20 sec. | 9.4 lb./in. |
| Blister | 260° C. solder float for 7 min. | No Blisters |
| Blister | 302° C. solder float for 3 min. | No Blisters |
| *Glass Transition (Tg) | ASTM Cond. A | 133.6° C. |
| Vol. Resistivity | Mil Std. 202 | $3 \times 10^8$ |
| Sur. Resistivity | Mil Std. 202 | $5.93 \times 10^4$ |
| Water Absorption | D-1/105 + DES + D-24/23 | 0.070% |
| Dielectric Breakdown | D-48/50 + D-1/2/23 | 60 |
| Dielectric Constant | D-24/23 | 4.63 |
| Dissipation Factor | D-24/23 | 0.0219 |
| Flex. Strength, length | ASTM Cond. A | 68,000 |
| Flex Strength, cross | ASTM Cond. A | 57,000 |
| Arc Resistance | D-48/50 + D-1/2/23 | 122 |

*Differential Scanning Calorimeter

These results indicate outstanding thermal properties, including outstanding heat distortion temperatures, i.e., Tg values, showing good thermal and dimensional stability and resistance to warpage, excellent bond strength, and moisture resistance, excellent flexural strength and electrical properties, and excellent solder resistance without blistering. This copper clad laminate is of the FR-4 class, and after copper etching to provide circuit patterns could be used as an outstanding circuit board.

The following example illustrates the invention with a prebrominated bisphenol A epoxy resin.

EXAMPLE 2

A mixing vessel was charged, at 25° C. with 9.42 parts by weight (9.42 weight percent) of methyl Cellosolve solvent, to which was added with good agitation, 77.93 parts by weight (77.93 weight percent) of a commercially available prebrominated bisphenol A epoxy resin sold by Dow Chemical Company as DER 511 A80, which has an EEW of about 482 and is an acetone solution containing 80 percent solids. This would contribute 0.129 epoxy equivalents (i.e., 77.93×0.80/482). When a uniform solution was obtained, 12.44 parts by weight (12.44 weight percent) of 100% solids phenolic novolac oligomer having an average hydroxyl equivalent weight of about 107 (Union Carbide's BRWE 5833) was added with good agitation. This amount of phenolic novolac would contain 0.116 phenolic equivalents (i.e., 12.44/107). After the phenolic novolac was dissolved, 0.21 parts by weight (0.21 weight percent) of 2-methyl imidazole was added and stirred for 30 minutes to provide a homogeneous solution. In this resin admixture, the combined total of phenolic hydroxyl equivalents (0.116) was less than the total epoxy equivalents (0.129). The ratio of epoxy equivalents:phenolic hydroxyl equivalents was 1.11 (0.129/0.116). Because the tetrabromobisphenol A in the prebrominated DER 511 epoxy resin has been reacted, it has essentially no phenolic hydroxyl groups available for reaction and is, therefore, ignored in calculating the total phenolic hydroxyl equivalents.

The resin may be substituted for the resin employed in Example 1 to prepare "B"-staged prepregs and a 1/16 inch flame resistant copper clad laminate with results equivalent to those set forth in Table 1.

The following example illustrates the invention with cycloalphiatic epoxy resin alone and as admixtures with bisphenol A epoxy resin.

EXAMPLE 3

Seven unreacted impregnating resin compositions were made by dissolving 100% solids phenolic novolac oligomer having an average hydroxyl equivalent weight of about 107 and a melt viscosity at 150° C. of from 800 cps. to 1000 cps., sold commercially by Union Carbide Corporation under the trade name "Phenolic Novolac BRWE 5555", in methyl Cellosolve solvent at 25° C., with good agitation, followed by addition of tetrabromobisphenol A (TBBPA). When the tetrabromobisphenol A was dissolved, 3,4-epoxycyclohexylmethyl-3,4-epoxycyclohexane carboxylate, a cycloaliphatic epoxy resin having an epoxy equivalent weight of 133 and a viscosity of from 350 cps. to 450 cps. at 25° C., sold commercially by Union Carbide Corporation under the trade name "ERL-4221", was charged, followed by the addition of the bisphenol A epoxy resin described in Example 1. Lastly, 2-methyl imidazole (2-MI) catalyst was added at 25° C., to provide a series of unreacted resinous solutions having viscosities ranging from about 250 cps. to about 300 cps. at 25° C. The composition of these formulations is shown in Table 2.

Style 7628, silane treated woven glass fiber cloth was impregnated with the seven described resin admixtures in a resin trough, passed between rollers to remove excess resin, and "B"-staged in a drying oven at about 160° C. for from 6 to 7 minutes, to provide a resin ratio of about 1.66. Shelf life of these "B"-staged prepregs was at least 90 days at 25° C.

Nine sheets of 7"×7" prepreg, containing Samples 1 through 7 resins, were molded at 1,000 psi and 170° C. for about 35 minutes. The resultant non-clad, 1/16 inch NEMA grade FR-4 circuit board laminates were then tested for glass transition (Tg) values. The results are given in Table 3.

TABLE 2

| | SAMPLE | | | | | | |
|---|---|---|---|---|---|---|---|
| | 1 | 2 | 3 | 4 | 5 | 6 | 7 |
| parts (wt. %) ERL 4221 | 35.13 | 31.82 | 29.10 | 25.78 | 22.48 | 15.25 | 18.57 |
| parts (wt. %) Epon 829 | — | 3.87 | 7.73 | 11.59 | 15.46 | 23.19 | 19.33 |
| parts (wt. %) TBBPA | 24.78 | 24.18 | 24.78 | 24.78 | 24.78 | 24.78 | 24.77 |
| parts (wt. %) BRWE 5555 | 14.94 | 14.51 | 13.47 | 13.03 | 12.58 | 12.31 | 12.75 |
| parts (wt. %) 2-MI | 0.15 | 0.15 | 0.15 | 0.15 | 0.15 | 0.15 | 0.15 |
| parts (wt. %) methyl Cellosolve | 25.00 | 24.87 | 24.77 | 24.67 | 24.55 | 24.32 | 24.43 |
| ratio of epoxy equivalents: | 1.14:1 | 1.15:1 | 1.16:1 | 1.15:1 | 1.16:1 | 1.16:1 | 1.15:1 |

TABLE 2-continued

| | SAMPLE | | | | | | |
|---|---|---|---|---|---|---|---|
| | 1 | 2 | 3 | 4 | 5 | 6 | 7 |
| phenolic hydroxyl equivalents | | | | | | | |

TABLE 3

| | LAMINATE SAMPLE | | | | | | |
|---|---|---|---|---|---|---|---|
| | 1 | 2 | 3 | 4 | 5 | 6 | 7 |
| *Glass Transition (Tg) | 160.9° C. | 155.6° C. | 148.9° C. | 148.3° C. | 147.7° C. | 139.8° C. | 144.7° C. |

*Differential Scanning Calorimeter

All the laminates were light in color and were well cured as tested by rubbing with acetone and various solvents. All were especially suitable for copper clad circuit board application. As can be seen, the addition of cycloaliphatic epoxy resin, though expensive, can dramatically increase Tg values, compare Table 3 with Table 1. For highest temperature applications, an all cycloaliphatic epoxy-phenolic novolac cured woven glass cloth based circuit board would be most useful.

We claim:

1. A porous substrate impregnated with a "B"-staged resin, the resin comprising a mixture of:
   (I) a brominated epoxy resin, or
   (II) a mixture of (A) a non-halogenated epoxy resin and (B) a flame retarding reactive additive containing bromine and phenolic hydroxyl groups, and
   (III) phenolic novolac oligomer curing agent having an average of over 2.5 phenolic hydroxyl groups per oligomeric unit.

2. The resin impregnated substrate of claim 1, where the combined total of phenolic hydroxyl equivalents is less than or essentially equal to the combined total of epoxy equivalents.

3. The resin impregnated substrate of claim 1 where the substrate is selected from the group consisting of cellulosic paper, fibrous polyamide sheet, fibrous quartz sheet, and fibrous glass sheet and where the resin also contains a catalyst selected from the group consisting of tertiary amine, imidazole, and mixtures thereof.

4. The resin impregnated substrate of claim 1, where the phenolic novolac oligomeric unit has an average of from 2.5 to 15 phenolic hydroxyl groups per oligomeric unit, and the ratio of epoxy equivalents:phenolic hydroxyl equivalents is from 1:1 to about 1.2:1.

5. The resin impregnated substrate of claim 1, where the phenolic novolac oligomeric unit has an average of from 4 to 8 phenolic hydroxyl groups per oligomer and less than 1 weight percent free phenol.

6. The resin impregnated substrate of claim 1, where the phenolic novolac oligomer (III) has the structural formula:

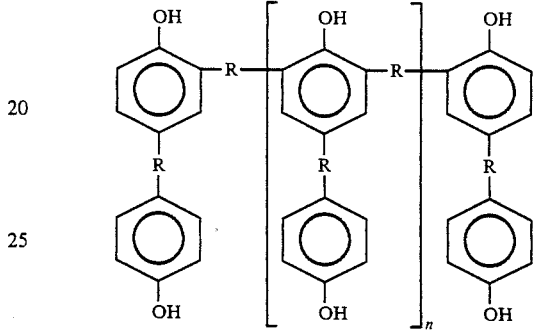

where the average of n=0 to 2, and each R is selected from $CH_2$, $C_2H_4$, and $C_3H_8$.

7. The resin impregnated substrate of claim 1, where the flame retarding additive is tetrabromobisphenol A.

8. The resin impregnated substrate of claim 1 or claim 5, where the epoxy resin (II)(A) is a bisphenol A resin and the flame retarding additive (II)(B) is tetrabromobisphenol A.

9. The resin impregnated substrate of claim 1 or claim 5, where the non-halogenated epoxy resin is a mixture of bisphenol A epoxy and cycloaliphatic epoxy and the flame retarding additive is tetrabromobisphenol A.

10. The resin impregnated substrate of claim 1 or claim 5, where the non-halogenated epoxy resin is a cycloaliphatic epoxy resin.

11. A plurality of resin impregnated fibrous glass cloth substrates according to claim 1, consolidated under heat and pressure into a flame resistant, unitary bonded laminate.

12. A plurality of the resin impregnated substrates of claim 1, along with at least one metal foil outer layer, consolidated under heat and pressure into a flame resistant, unitary, bonded metal clad laminate.

13. A flame resistant, heat and pressure consolidated laminate comprising:
   (I) at least one metal foil outer layer,
   (II) a support layer comprising at least one resin impregnated sheet, bonded to the metal foil, the sheet impregnated with a cured resin reaction product admixture of:
      (I) a brominated epoxy resin, or
      (II) a mixture of (A) a non-halogenated epoxy resin and (B) a flame retarding reactive additive containing bromine and phenolic hydroxyl groups, and
      (III) phenolic novolac oligomer curing agent having an average of over 2.5 phenolic hydroxyl groups per oligomeric unit.

14. The copper clad laminate of claim 13, where the sheets are selected from the group consisting of cellulosic paper, fibrous polyamide sheet, fibrous quartz sheet, woven fibrous glass cloth, unwoven fibrous glass mat, and combinations thereof, where the combined total of phenolic hydroxyl equivalents is less than or essentially equal to the combined total of epoxy equivalents, and where the resin also contains a catalyst selected from the group consisting of tertiary amine, imidazole, and mixtures thereof.

15. The copper clad laminate of claim 13, where the phenolic novolac oligomeric unit has an average of from 2.5 to 15 phenolic hydroxyl groups per oligomer and where the ratio of epoxy equivalents:phenolic hydroxyl equivalents is from 1:1 to 1.2:1.

16. The copper clad laminate of claim 13, where the substrate is selected from the group consisting of woven fibrous glass cloth, unwoven fibrous glass mat, and mixtures thereof, and the phenolic novolac oligomeric unit has an average of from 4 to 8 phenolic hydroxyl groups per oligomer and less than 1 weight percent free phenol.

17. The copper clad laminate of claim 13, where the metal foil is copper and has a conductive pattern, the flame retarding additive consists essentially of tetrabromobisphenol A, and the bromine content of the cured resin ranges from about 10 weight percent to about 20 weight percent.

18. The copper clad laminate of claim 13, where the support layer comprises a woven fibrous glass cloth core and woven fibrous glass cloth outer layers.

19. The copper clad laminate of claim 13, where the support layer comprises a cellulosic paper core and woven fibrous glass cloth outer layers.

20. The copper clad laminate of claim 13, where the support layer comprises unwoven fibrous glass mat and woven fibrous glass cloth outer layers.

21. The copper clad laminate of claim 17, where the non-halogenated epoxy resin is a bisphenol A resin.

22. The copper clad laminate of claim 17, where the non-halogenated epoxy resin is a mixture of bisphenol A epoxy and cycloaliphatic epoxy.

23. The copper clad laminate of claim 17, where the non-halogenated epoxy resin is a cycloaliphatic epoxy resin.

* * * * *